United States Patent [19]
Wada et al.

[11] Patent Number: 5,301,155
[45] Date of Patent: Apr. 5, 1994

[54] MULTIBLOCK SEMICONDUCTION STORAGE DEVICE INCLUDING SIMULTANEOUS OPERATION OF A PLURALITY OF BLOCK DEFECT DETERMINATION CIRCUITS

[75] Inventors: Tomohisa Wada; Shuji Murakami, both of Hyogo, Japan

[73] Assignee: Mitsubishi Denki Kabushiki Kaisha, Tokyo, Japan

[21] Appl. No.: 670,811

[22] Filed: Mar. 18, 1991

[30] Foreign Application Priority Data

Mar. 20, 1990 [JP] Japan ................................ 2-71367

[51] Int. Cl.$^5$ ........................................... G11C 29/00
[52] U.S. Cl. .......................... 365/201; 365/189.02; 365/189.04
[58] Field of Search ................ 365/189.02, 189.04, 365/189.07, 189.08, 201

[56] References Cited

U.S. PATENT DOCUMENTS

| | | | |
|---|---|---|---|
| 4,161,040 | 7/1979 | Satoh | 365/203 |
| 4,464,750 | 8/1984 | Tatematsu | 371/21 |
| 4,541,090 | 9/1985 | Shiragasawa | 365/201 X |
| 4,542,486 | 9/1985 | Anami et al. | 365/230.02 |
| 4,654,849 | 3/1987 | White, Jr. et al. | 371/21 |
| 4,672,582 | 6/1987 | Nishimura et al. | 365/201 |
| 4,692,901 | 9/1987 | Kumanoya et al. | 365/201 |
| 4,916,700 | 4/1990 | Ito et al. | 365/201 X |
| 4,991,139 | 2/1991 | Takahashi et al. | 365/201 |

FOREIGN PATENT DOCUMENTS

| | | |
|---|---|---|
| 0283906 | 3/1988 | European Pat. Off. . |
| 3916533A1 | 5/1989 | Fed. Rep. of Germany . |
| 57-17997 | 4/1981 | Japan . |
| 61-51700 | 8/1984 | Japan . |
| 2226644 | 5/1989 | United Kingdom . |

OTHER PUBLICATIONS

Textbook, "VLSI Technology", Sze, McGraw-Hill, 1988.
IEEE Journal of Solid-State Circuits, "A 34-ns 1-Mbit CMOS SRAM Using Triple Polysilicon", vol. SC-22, No. 5, Oct. 1987, Wada, et al.
Kumanoya et al., "A Reliable 1-Mbit DRAM with a Multi-Bit-Test Mode", IEEE Journal of Solid-State Circuits, vol. SC-20, No. 5 (Oct. 1985) pp. 909-913.
McAdams, et al., "A 1-Mbit CMOS Dynamic RAM with Design-For Test Functions", IEEE Journal of Solid-State Circuits, vol. SC-21, No. 5 (Oct. 1986) pp. 635-642.
Wada et al., "A 34-ns 1-Mbit CMOS SRAM Using Triple Polysilicon", IEEE Journal of Solid-State Circuits, vol. SC-22, No. 5 (Oct. 1987).

*Primary Examiner*—Steven Mottola
*Attorney, Agent, or Firm*—Lowe, Price, LeBlanc & Becker

[57] ABSTRACT

A semiconductor storage device including a plurality of blocks each having an array of memory cells includes an exclusive OR circuit provided in each of the plurality of blocks for making a determination as to whether data written in memory cells in the blocks are normally read. Exclusive OR circuits of a plurality of memory cell array blocks are connected to an OR circuit. With an output signal from the OR circuit, a determination is made as to whether a plurality of memory cell array blocks are normal or not. Since test data from a plurality of memory cell array blocks are simultaneously examined by an OR circuit, a test time for the semiconductor storage device can be reduced.

8 Claims, 8 Drawing Sheets

MULTIBLOCK SEMICONDUCTION STORAGE DEVICE INCLUDING SIMULTANEOUS OPERATION OF A PLURALITY OF BLOCK DEFECT DETERMINATION CIRCUITS

BACKGROUND OF THE INVENTION

1. Field of the Invention

The present invention relates to semiconductor storage devices, and more particularly to semiconductor storage devices in which test time for testing operation thereof can be reduced.

2. Description of the Background Art

FIG. 4 is a block diagram showing a circuit configuration of a common CMOS type static random access memory. Referring to FIG. 4, a CMOS type static random access memory (hereinafter referred to as "SRAM") includes a memory cell array 1 having memory cells two-dimensionally arranged in row and column directions, an X decoder 31 for selecting cells in memory cell array 1 in the row direction, and a Y decoder 32 for transmitting a signal selecting cells in memory cell array 1 in the column direction to a multiplexer 3. The data of a memory cell transmitted through multiplexer 3 is sensed and amplified by a sense amplifier 4. The data amplified by sense amplifier 4 is transmitted through an output buffer circuit 10 out of SRAM 30. Multiplexer 3 also has writing circuits 12 for transmitting written data to memory cells. Data is transmitted to writing circuit 12 from a data input buffer 15. Both of output buffer circuit 10 and data input buffer 15 are connected to a data input/output pin 16, through which data is transmitted into/out of the chip.

Input signals of X decoder 31 and Y decoder 32 are made by an X address buffer 43 and a Y address buffer 44, respectively. The data to X address buffer 43 and Y address buffer 44 are supplied as inputs through an X address input pin 45 and a Y address input pin 46. SRAM 30 further includes a chip selector input pin 17 for inputting a signal switching the chip operation state of SRAM 30 to either of selection/non-selection, reading/writing control input pin 18 to which a signal controlling reading/writing states of the chip is inputted, and a reading/writing control circuit 19 receiving a chip selector input signal and a reading/writing control input signal for control inside the chip.

In FIG. 4, a SRAM 30 having 4-bit configuration simultaneously processing 4 data is shown. Accordingly, memory cell array 1 is divided into four sub-arrays, which are named as I/01, I/02, I/03, I/04, respectively. Four sets of sense amplifiers 4, writing circuits 12, output buffers 10, data input buffers 15 and data output pins 16 are provided, respectively, each of which corresponds to each of four sub-arrays described-above.

Next, operation of a conventional SRAM 30 will be described. An X address input signal is supplied as an input to an X address buffer 43 through an X address input pin 45, and its output signal is decoded by an X decoder 31 to select a single row in memory cell array 1. In the same way, a Y address input signal is supplied to a Y address buffer 44 through a Y address input pin 46. Its output signal is decoded by a Y decoder 32 and a single column in each sub-array is selected by multiplexer 3.

When a chip select input signal is supplied through a chip select input pin 17 to set the chip in a selected mode, reading/writing operations from/into SRAM 30 are enabled. When a signal is inputted through a reading/writing control input pin 18 to select a reading mode, sense amplifier 4 and data input/output buffer 10 are activated by a reading/writing control circuit 19. The writing circuit 12 and data input buffer 15 are inactivated. The data of a memory cell on a column selected by Y decoder 32 among memory cells on a row selected by X decoder 31 is transmitted to sense amplifier 4 through multiplexer 3, and is amplified by sense amplifier 4. The data is transmitted to output buffer 10, and supplied as an output by the output buffer 10 to a data input/output pin 16 of SRAM 30.

On the other hand, a writing mode signal is inputted through reading/writing control input pin 18, then sense amplifiers 4 and data input/output buffers 10 are inactivated by reading/writing circuit 19. Writing circuits 12 and data input buffers 15 are activated. Similarly to the reading mode, the data of data input/output pin 16 is transmitted to a selected memory cell through data input buffer 15 and writing circuit 12, and is written into the memory cell.

When a non-selection mode signal is supplied to a chip select input pin 17, regardless of a state of the reading/writing control input pin 18, all of sense amplifiers 4, writing circuits 12, data output buffers 10 and data input buffers 15 are inactivated. Accordingly, both of the reading and writing operations are forbidden.

Next, the circuit configuration around the memory cells will be described in detail. FIG. 5 is a diagram showing a circuit configuration in a single sub-array of a typical SRAM, which corresponds to the portion designated by V of FIG. 4. The X decoder 31 is configured with a plurality of AND gates having a plurality of inputs. Multiplexer 3 includes a plurality of N channel MOSFET. A memory cell 20 is connected to an output signal line of X decoder 31, or a row selecting line (a word line) 22, and a bit line pair 21. In memory cell array 1, a bit line clamping circuit (bit line load) 23 is provided for clamping the potential of bit line 21 at a given potential.

An X address input signal is finally decoded by X decoder 31, one of a number of word lines 22 is selected, and memory cells 20 are connected to bit lines 21. A Y address input signal is finally decoded by Y decoder 32, and one pair among bit line pairs 21 is connected to sense amplifier 4 and writing circuit 12 by multiplexer 3. As a result, the data is read or written from/into a single memory cell 20 specified with the X address input signal and the Y address input signal.

A test for seeing if defect/nondefect is required for such a SRAM 30 as shown in FIGS. 4 and 5. In this test, since the SRAM shown in the figures has four data input/output pins 16, 4 bits of memory cells can be simultaneously tested.

The details of such operations of a SRAM are described in U.S. Pat. Nos. 4,542,486 and 4,161,040, for example.

In a certain test method, four pieces of identical data are written into the 4 bits of memory cells and read out. Since the data of four memory cells simultaneously tested are identical, a test can be made by checking to see if identical data are read out as outputs of four sense amplifiers 4 without individually examining data appearing at data input/output pins 16 of the chip by reading operation. Such a test method is described in U.S. Pat. Nos. 4,464,750 and 4,654,849, and Japanese Patent Publication Nos. 57-179997 and 61-51700, for example.

FIG. 6 shows conditions in the case of memory cell array 1 divided into a plurality of blocks when a SRAM has a large capacity. In the figure, (1) corresponds to the memory cell array 1 shown in FIG. 4, and (2) shows an example which is divided into two. Since the memory capacity (the number of memory cells) is the same with respect to both cases of (1) and (2), the length of word line 22 is $\frac{1}{2}$. Since a word line 22 generally has resistance, the resistance of the word line 22 is $\frac{1}{2}$. Also, the number of memory cells 20 on a single word line 22 is $\frac{1}{2}$, the capacity driven by word line 22 is $\frac{1}{2}$. As a result, CR (resistance.capacity product) indicating a delay time with respect to writing/reading of memory cell 20 is $\frac{1}{4}$, which fasten the selection speed of memory cell 20, resulting in an advantage of speed-up. The memory cell 20 of the SRAM consumes a large amount of current when selected (when the potential of word line 22 attains H). As shown in (2) of FIG. 6, by dividing memory cell array 1, the number of memory cells 20 selected at the same time can be reduced to $\frac{1}{2}$. As a result, the consumption power of memory cell array 1 can be reduced. Accordingly, even if memory cell array 1 is divided into a number of blocks, only one word line in one block is generally selected.

FIG. 7 is a block diagram showing a portion where an output signal of a SRAM including two or more blocks 1 of a memory cell array is processed. In FIG. 7, for simplification, data input buffer 15, writing circuit 12, X address buffer 43, Y address buffer 44, Y decoder 32 and so forth are omitted.

Generally, when a memory cell array 1 is divided into a plurality of blocks, the test of memory cell array 1 is sequentially made for each block. This is because, as described-above, memory cell blocks not used are not selected in order to reduce the consumption current. That is to say, the memory cell blocks to which a test is not applied are in normal waiting conditions. The contents thereof will be specifically described next.

Referring to FIG. 7, memory cell array 1 is divided into a memory cell array block A, a memory cell array block B etc.. Sense amplifiers 4a and 4b connected to each memory cell array block A and B are connected to data output lines through transfer gates 41a and 41b, respectively, and each data output line is connected to data input/output pin 16 through an output buffer circuit 10. The data output line is connected to a data check circuit 5, and an output from the data check circuit 5 is supplied as an output out of the chip through check data output pin 24.

The case where memory cell array block A is tested will be described. Sense amplifier 4a of block A is then connected to output buffer 10 and data check circuit 5 through transfer gate 41a by a block selector BS1. After completion of the test of block A, the sense amplifier 4a of block A is separated by block selector BS1. Subsequently, sense amplifier 4b of block B is connected to data check circuit 5 and output buffer 10 through transfer gate 41b instead.

Such division of a SRAM into a plurality of blocks is described in IEEE Journal of Solid-state Circuits, Vol. SC-22, No. 5; October, 1987 "A 34-ns 1Mbit CMOS SRAM Using Triple Polysilicon", for example.

Block selector signals BS1, BS2 are provided from a test mode selecting circuit (not shown).

Next, a specific testing method will be described referring to FIG. 8. FIG. 8 is a diagram schematically showing conditions for testing a test device with an LSI memory tester 35. Referring to FIG. 8, the LSI memory tester 35 includes an input signal outputting portion 36 for outputting a predetermined input signal to the test device, and an output signal determining portion 37 for making a determination as to if the test device is defective or not by comparing an output signal from the test device with the input signal. An input signal (including an address signal and a control signal) is supplied to the test device from LSI memory tester 35. A comparison is made between an expected value which is expected to be supplied as an output from the test device and an actual output signal of the test device to see if the test device is normally functioning or not. When the SRAM 30 in FIG. 7 is a test device, a determination is made as described below. The data check circuit 5 is an exclusive OR circuit. The output data from each sense amplifier 4a and 4b should originally coincide with each other, so that a determination is made by the data check circuit 5 that the SRAM is defective only when all of the data do not coincide, and L is supplied to a check data output pin 24 as a FAIL signal.

A conventional semiconductor storage device was configured as described-above. Only one data check circuit 5 was provided for a plurality of memory cell array blocks. Accordingly, it was necessary to sequentially test for each block of the memory cell array in order to see if a plurality of memory cell array blocks were defective/nondefective. The conditions will be described referring to FIG. 9. That is, if a checking time for a single memory cell array block is expressed as $T_0$, with a memory cell array divided into 16 blocks, the test time is $T = 16 \times T_0$ as shown in the figure. That is, there has been a problem of an increase in manufacturing cost because an increase in the capacity of a memory increases the number of blocks of a memory cell array 1, which increase the test time.

SUMMARY OF THE INVENTION

Accordingly, it is an object of the present invention to reduce a time necessary for a test of defective/non defective in a semiconductor storage device with large capacity.

It is another object of the present invention to reduce manufacturing cost in a semiconductor storage device with large capacity.

It is still another object of the present invention to reduce a test time of defective/nondefective in a test method of a semiconductor device with large capacity.

It is yet another object of the present invention to provide a test method in which manufacturing cost can be reduced in a semiconductor storage device with large capacity.

The above objects of the present invention can be achieved by a semiconductor storage device including the following elements. That is to say, a semiconductor storage device according to the present invention includes a plurality of blocks each having a memory cell array, memory cell operation determining circuits provided in each of the plurality of blocks for making a determination as to whether data written in memory cells in each block are normally read out or not, and a simultaneous determination circuit for simultaneously operating at least two or more memory cell operation determining circuits.

A memory cell determination circuit is provided in each of a plurality of memory cell array blocks, and operation of at least a plurality of memory cell array blocks are simultaneously examined. As a result, in a semiconductor storage device, a determination can be made quickly as to whether memory cells are defective or nondefective.

In another aspect of the present invention, a determination method for a semiconductor storage device including a plurality of blocks each including an array of memory cells includes the steps of writing given data into arrays of memory cells of a plurality of blocks, simultaneously reading out the written data from memory cell arrays of a plurality of blocks, and simultaneously making a determination as to whether they are defective/nondefective on the basis of the simultaneously read data.

Since operations of a plurality of memory cell array blocks are simultaneously examined, it is not necessary to individually test a plurality of memory cell blocks as is a conventional case. As a result, a test method for a semiconductor storage device in which a determination about defective/nondefective of memory cells can be quickly made is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
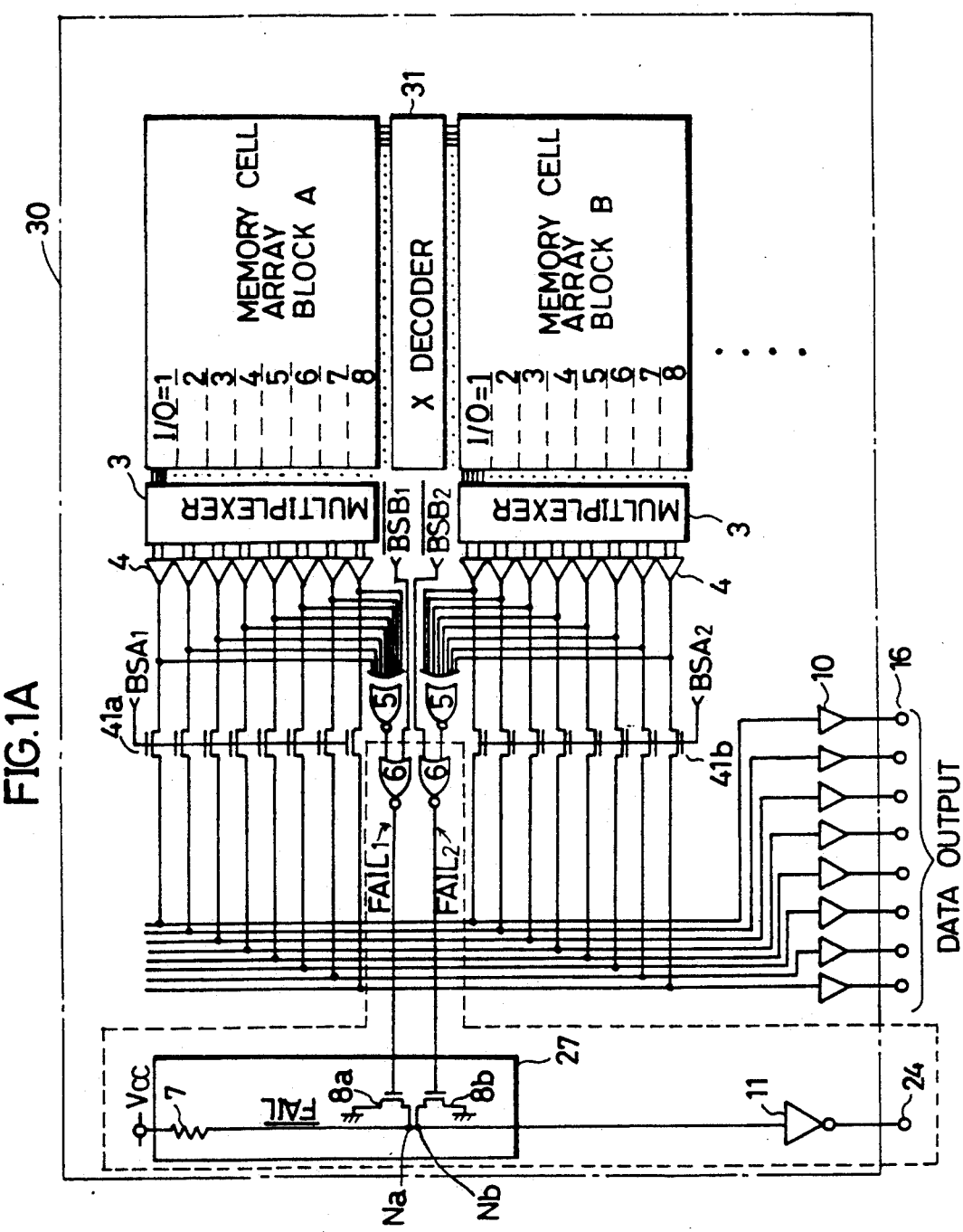
FIGS. 1A and 1B are block diagrams of a SRAM as an embodiment of a semiconductor storage device according to the present invention.
Figure 7:
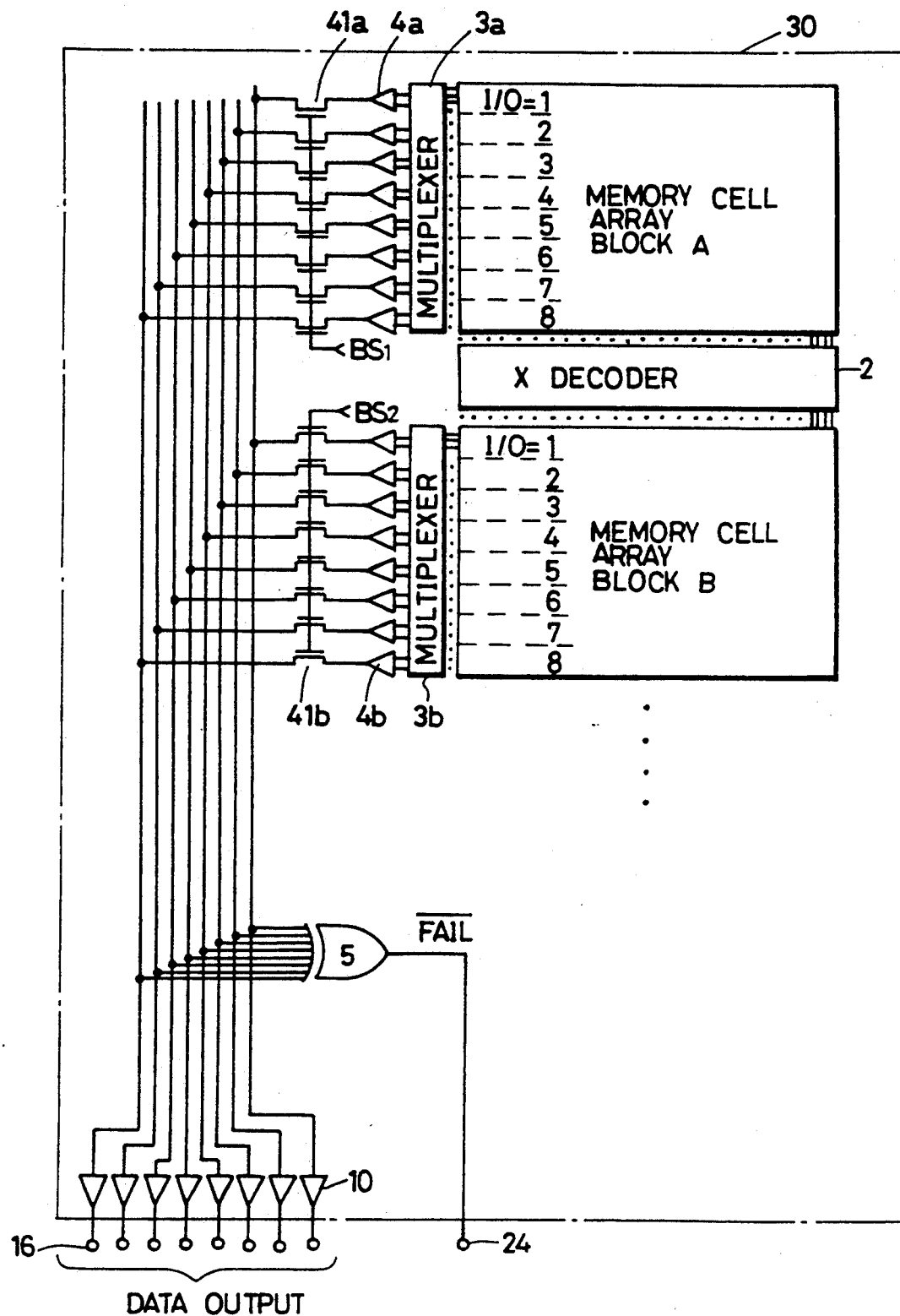
FIG. 7 is a block diagram showing a main portion of a conventional SRAM.

One embodiment of the present invention will be described below referring to the figures. FIG. 1A is a block diagram showing a main portion of a semiconductor storage device showing one embodiment of the present invention. FIG. 1A corresponds to FIG. 7 described in the background art. The same characters are assigned to the same or corresponding portions as or to those in FIG. 7 and the description thereof is not repeated. Referring to FIG. 1A, a semiconductor storage device according to the present invention includes data check circuits 5 connected to respective sense amplifiers of a plurality of memory cell array blocks A and B, and check data control circuits 6 each responsive to an output of data check circuit 5 and input of each of signals $\overline{BSB1}$, $\overline{BSB2}$ indicating execution of a predetermined data check for supplying as an output a signal FAIL showing that the corresponding memory cell array blocks A, B are non defective or defective. The semiconductor storage device according to the present invention includes an OR circuit 27 provided with a check data output signal provided for each memory cell array block and supplying as an output a signal indicating if the entirety of SRAM 30 is a non defective/defective product according to the signal.

The OR circuit 27 includes a resistor 7 connected to a power source potential Vcc, and MOSFETs 8a and 8b operating in response to signals from check data control circuits 6 of respective memory cell array blocks A and B. An output from OR circuit 27 is externally supplied from a check data output pin 24 through a buffer circuit 11.

Figure 2:
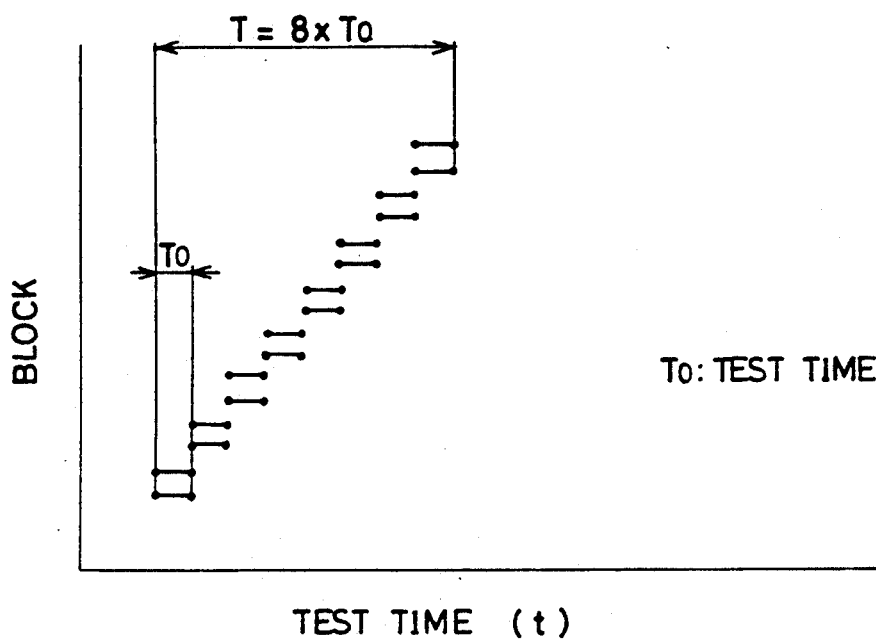
FIG. 2 is a diagram for describing effects of the present invention.
Figure 9:
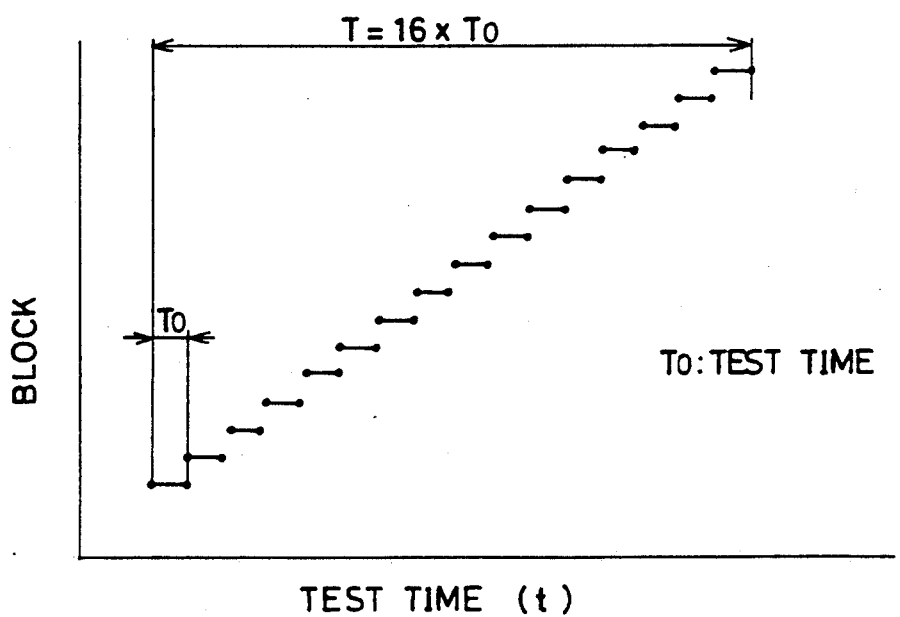
FIG. 9 is a diagram for describing conventional problems.

Next, operation of the SRAM shown in FIG. 1A will be described. In the SRAM 30 shown in FIG. 1A, a normal operation mode performing normal reading/writing and so forth and a test mode employing data check circuits 5 are provided. In the test mode, data check is carried out employing data check circuit 5. As shown in FIG. 1A, if data check circuit 5 is provided for each memory cell array block A and B, a plurality of blocks can be checked simultaneously. If there are 16 blocks in all, it is necessary to sequentially test 16 blocks as shown in FIG. 9 in a conventional method. If the test is performed while simultaneously activating two blocks at each time, however, eight times of sequential tests are apparently sufficient. As a result, the test time can be reduced to ½ as compared to the conventional case as shown in FIG. 2. Also, if the test is given to four blocks simultaneously, four times of sequential tests are sufficient, so that the test time is reduced to ¼.

In the test mode, signals $\overline{BSA1}$, $\overline{BSA2}$, and so on indicating that a check is made about the corresponding memory cell array blocks A and B from a test mode selecting circuit (not shown) are made non-selection state, and transfer gates 41a and 41b are turned OFF. Simultaneously, signals $\overline{BSB1}$ and $\overline{BSB2}$ for activating corresponding blocks are supplied as outputs from a test mode selecting circuit (not shown). With the signals $\overline{BSB1}$, $\overline{BSB2}$ attaining "L" (activate), the specified memory cell-array blocks A and B are selected. An output of the checked result from check data control circuit 6 is transmitted to OR circuit 27, and the check result is supplied as an output from check data output pin 24 through buffer circuit 11.

Next, specific check contents will be described. Now, it is assumed that a check is performed on the memory cell array block A, for example. First, transfer gate 41a is non-selected, and a signal $\overline{BSB1}$ is supplied as an output as "L". The identical data are written into the memory cell array block A in advance through data input/output pins 16, data input buffers and writing circuits (not shown in the figure). Data check circuit 5 is formed of an exclusive NOR circuit, which supplies an "H" signal as an output only when the output data from respective memory cells are equal. Accordingly, when the memory cell array block A is normal, the identical "L" data are supplied, so that an output signal of data check circuit 5 attains "H". The signal $\overline{BSB1}$ and an output signal from data check circuit 5 are supplied to check data control circuit 6. Check data control circuit 6 is formed of an NOR circuit. If the memory cell array block A is normal, as an input signal of $\overline{BSB1}$ is "L" and that of data check circuit 3 is "H", an output signal FAIL 1 from check data control circuit 6 is at "L". The signal turns OFF the MOSFET 8a, and the potential of a node Na is "H". As a result, a signal "L" is supplied as an output from check data output pin 24.

When a check is performed on a plurality of blocks A and B, it is carried out as described below. Check data from a plurality of memory cell array blocks A, B are supplied to OR circuit 27. If memory cell array blocks A, B simultaneously checked are normal, the potentials at respective nodes Na, Nb are all "H". As a result, a signal "L" externally supplied as an output through check data output pin 24. As a result, a determination is made that the checked memory cell array blocks A, B are normal.

On the other hand, if the memory cell array block A is defective, for example, the check is performed as described below. That is, when even a single memory cell 20 in memory cell array block A is defective, an output signal of data check circuit 5 is supplied as an "L" signal. As a result, an output signal from check data control circuit 6 attains "H", and MOSFET8 is turned ON. As a result, an output signal from check data output pin 24 attains "H", and the checked memory cell array block A is regarded as defective.

The OR circuit 27 is employed as a circuit for simultaneously examining signals of a plurality of memory cell array blocks A, B to be checked here. The circuit, however, is only to simultaneously evaluate a plurality of output signals, so that it is not limited to an OR circuit, and the following approaches can be taken, for example.

Figure 1B:
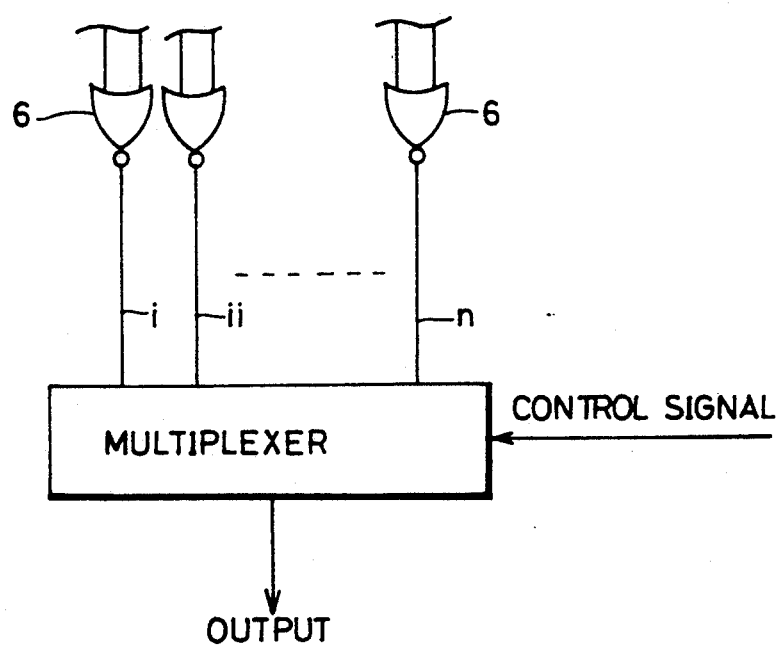

That is, an output signal of check data control circuit 6 of each block may be supplied out of a chip without any processing, OR data of outputs of check data control circuits may be partially taken to be supplied out of the chip as outputs, or an output of check data control circuit 6 may be provided out of the chip as shown in FIG. 1B.

Next, the contents shown in FIG. 1B will be described. FIG. 1B shows a portion surrounded by a broken line of FIG. 1A, which is a schematic diagram showing a portion after the check data control circuit 6 provided for each block. One of outputs of n data control circuits 6 is selected with a control signal, which signal is externally outputted.

Furthermore, in the present embodiment, the data check circuit 5 is formed of an exclusive NOR circuit, which checks the output data of memory cell array block A, B. On the other hand, increasing the number of inputs of the data check circuit 5 by one, a determination may be made as to whether memory cell array blocks A, B are defective/nondefective by introducing an expected value of data therein. If this approach is taken, the problem does not occur in which a determination of nondefective is made when all of memory cell arrays 20 forming memory cell array blocks A, B are defective.

Figure 3:
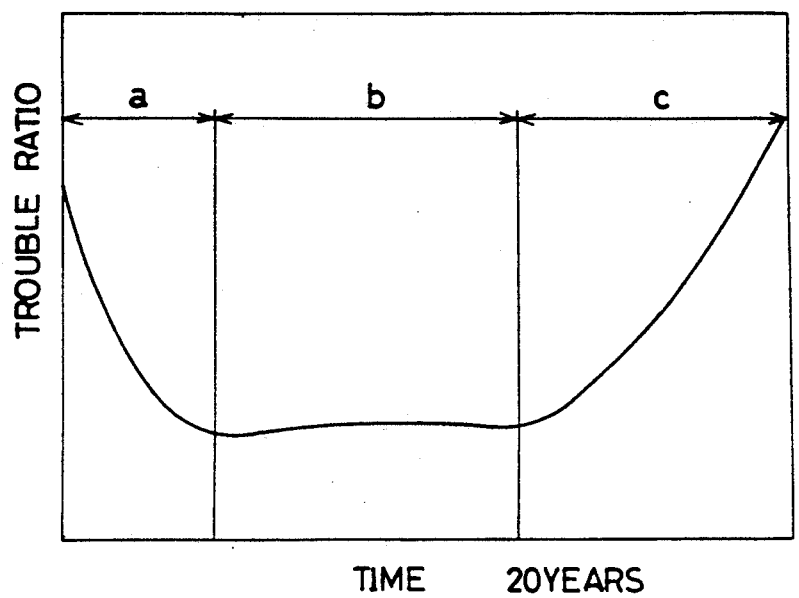
FIG. 3 is a diagram showing the time dependence of a defective of a semiconductor storage device.
Figure 8:
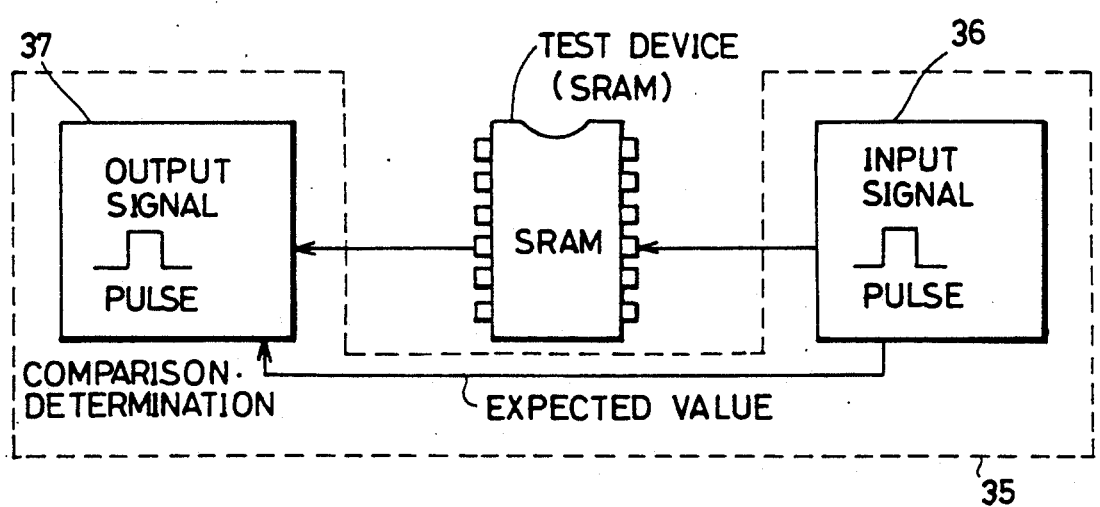
FIG. 8 is a diagram for describing a test method of a SRAM.
Figure 4:
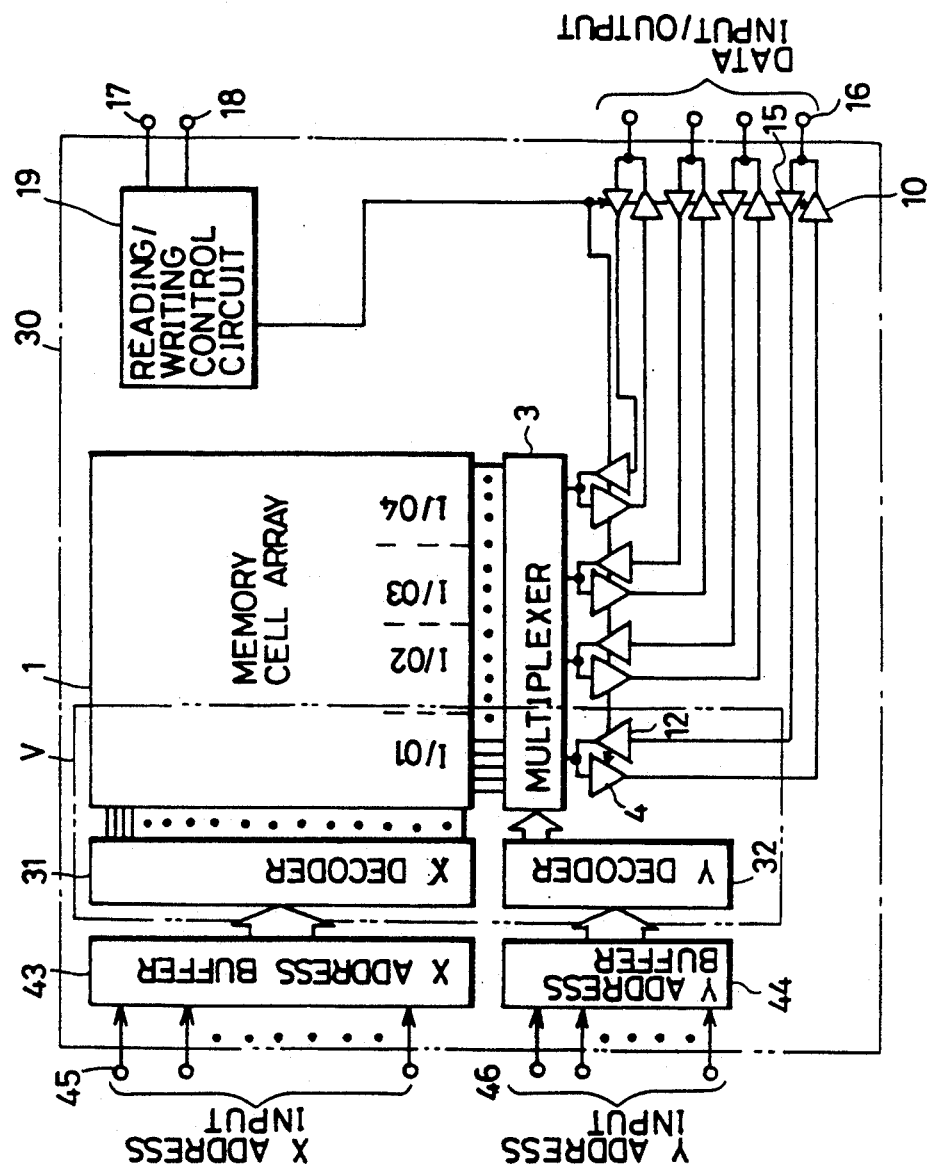
FIG. 4 is a block diagram showing the entirety of a SRAM showing the background of the present invention.
Figure 5:
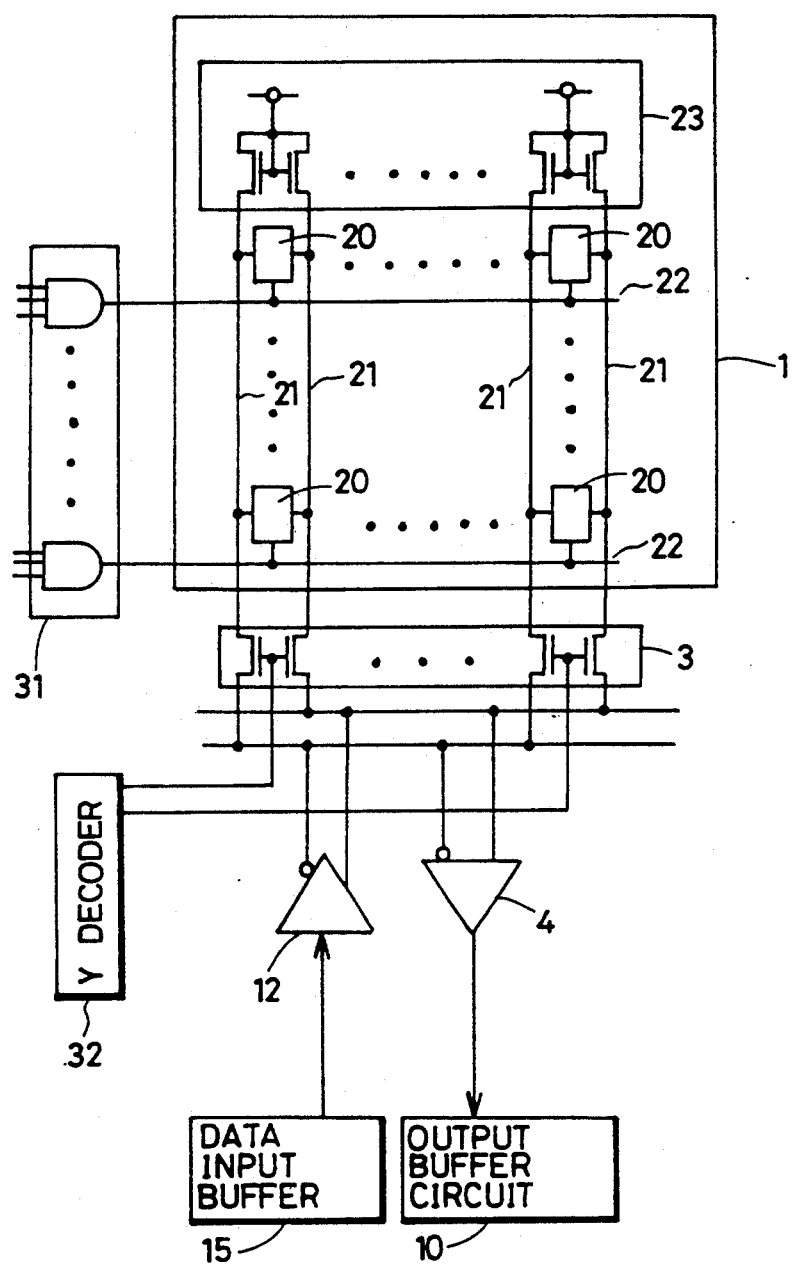
FIG. 5 is a diagram showing a main portion of a SRAM.
Figure 6:
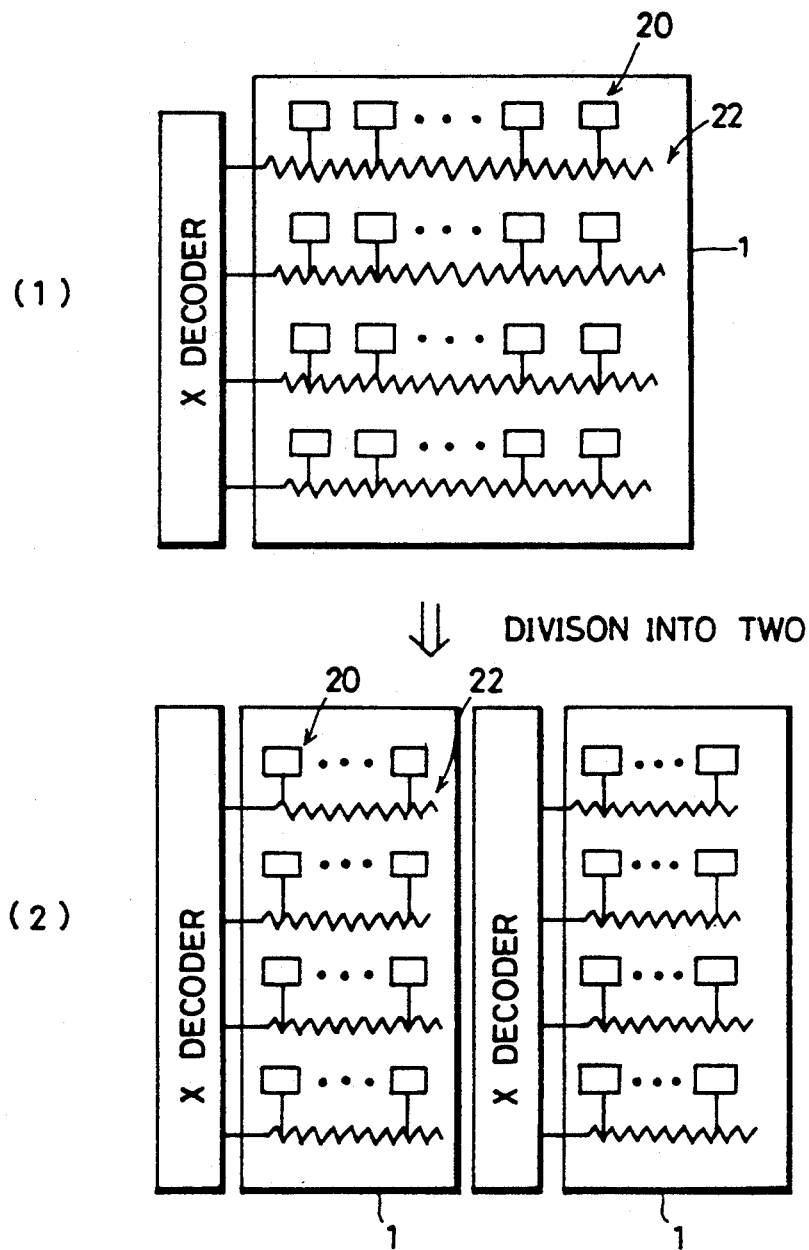
FIG. 6 is a diagram for describing division of a memory cell array.

Next, other applications of the present invention will be described. Generally, a burn-in test with high temperature and a high voltage is performed to make a determination as to whether semiconductor storage devices are nondefective or defective. The general time dependence of troubles of semiconductor storage devices is shown in FIG. 3. That is, it can be divided into an initial trouble region "a" occurring in initial use, an accidental trouble region "b" occurring at a constant percentage according to the manufacturing technology level, and wearing trouble region "c" occurring because of so-called life span limit. Among these regions, "b" and "c" are substantial fails which require enhancement in the reliability technology. On the other hand, the troubles in the "a" region can be removed by early detection. The process of intentionally accelerating the occurrence of fails in this region is referred to as "aging". An acceleration method in which devices are placed for a predetermined time in a high-temperature atmosphere in which a high voltage is produced is generally taken. Although the voltage and temperature depend on the device, values which can implement convergence of initial troubles in the shortest time period without damaging are selected as a test voltage and a test temperature.

Such initial troubles occur due to breakdown of a gate oxide film, for example. The details about such a burn-in test is described in "VLSI TECHNOLOGY" S. M. Sze McGraw-Hill, for example.

In the semiconductor storage device according to the present invention, a plurality of memory cell array blocks can be simultaneously tested in such a burn-in test, so that its time can be considerably reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor storage device, comprising:
a plurality of blocks each including an array of memory cells;
means for writing identical data into a plurality of memory cells in each of at least two blocks;
a plurality of memory cell operation determination means each provided corresponding to a block for simultaneously reading data from the plurality of memory cells in each block in which said identical data was written and making a determination as to whether the read data are all identical; and
simultaneous determination means for simultaneously operating at least two of said plurality of memory cell operation determination means.

2. The semiconductor storage device according to claim 1, wherein said memory cell operation determination means comprises data writing means for writing predetermined data into said memory cells and data reading means for reading said written data, and makes a determination as to whether said written data and read data are identical or not.

3. The semiconductor storage device according to claim 2, wherein said operation determination means comprises a logic circuit.

4. The semiconductor storage device according to claim 3, wherein said logic circuit comprises an exclusive logic NOR circuit.

5. The semiconductor storage device according to claim 1, wherein said simultaneous determination means makes a determination about said plurality of blocks on the basis of a determination result of each of said operation determination means.

6. The semiconductor storage device according to claim 5, wherein said simultaneous determination means comprises a logic circuit.

7. The semiconductor storage device according to claim 6, wherein said logic circuit comprises an electric field effect element operating in response to an output of said each determination means.

8. A method of making a determination whether a semiconductor storage device, including a plurality of blocks each having an array of memory cells, is defective, comprising the steps of:

writing identical data into a plurality of memory cells in at least two blocks; and
concurrently, for said at least two blocks, simultaneously reading the data from the plurality of memory cells in which said identical data was written and determining whether the read data are all identical.

* * * * *

UNITED STATES PATENT AND TRADEMARK OFFICE
CERTIFICATE OF CORRECTION

PATENT NO. : 5,301,155
DATED : April 5, 1994
INVENTOR(S) : Tomohisa WADA et al.

It is certified that error appears in the above-indentified patent and that said Letters Patent is hereby corrected as shown below:

On the title page, item [54] should read as follows:
and col. 1, lines 1-4,

MULTIBLOCK SEMICONDUCTOR STORAGE DEVICE INCLUDING SIMULTANEOUS OPERATION OF A PLURALITY OF BLOCK DEFECT DETERMINATION CIRCUITS--

Signed and Sealed this

Twenty-fourth Day of October, 1995

*Attest:*

BRUCE LEHMAN

*Attesting Officer*     *Commissioner of Patents and Trademarks*